(12) United States Patent
Johansson et al.

(10) Patent No.: US 9,075,099 B2
(45) Date of Patent: Jul. 7, 2015

(54) METHOD FOR ADAPTATION OF GROUND FAULT DETECTION

(75) Inventors: Henrik Johansson, Vasteras (SE); Joseph Menezes, Vasteras (SE); Stefan Roxenborg, Vasteras (SE); Tord Bengtsson, Vasteras (SE)

(73) Assignee: ABB RESEARCH LTD. (CH)

( * ) Notice: Subject to any disclaimer, the term of this patent is extended or adjusted under 35 U.S.C. 154(b) by 0 days.

(21) Appl. No.: 14/002,929

(22) PCT Filed: Mar. 3, 2011

(86) PCT No.: PCT/EP2011/053232
§ 371 (c)(1),
(2), (4) Date: Sep. 3, 2013

(87) PCT Pub. No.: WO2012/116757
PCT Pub. Date: Sep. 7, 2012

(65) Prior Publication Data
US 2013/0335098 A1    Dec. 19, 2013

(51) Int. Cl.
*G01R 31/14* (2006.01)
*G01R 31/06* (2006.01)
*G01R 31/34* (2006.01)
*H02H 3/00* (2006.01)
*G01R 31/02* (2006.01)
*H02H 1/00* (2006.01)
*H02H 3/08* (2006.01)
(Continued)

(52) U.S. Cl.
CPC .............. *G01R 31/025* (2013.01); *H02H 1/003* (2013.01); *H02H 3/08* (2013.01); *H02H 7/00* (2013.01); *H02H 7/0822* (2013.01); *G01R 31/343* (2013.01)

(58) Field of Classification Search
CPC ........... H02H 1/003; H02H 1/00; H02H 3/08; H02H 7/0822; H02H 7/00
See application file for complete search history.

(56) References Cited

U.S. PATENT DOCUMENTS 4,667,262 A * 5/1987 Maier .............................. 361/42
4,833,564 A   5/1989 Pardue et al.
(Continued)

FOREIGN PATENT DOCUMENTS

WO        9919963 A1    4/1999
WO    2010069739 A1    6/2010

OTHER PUBLICATIONS

International Preliminary Report on Patentability Application No. PCT/EP2011/053232 Completed: Mar. 21, 2013 22 pages.
(Continued)

*Primary Examiner* — Patrick Assouad
*Assistant Examiner* — Hoang X Nguyen
(74) *Attorney, Agent, or Firm* — Whitmyer IP Group LLC

(57) ABSTRACT

A method for adapting a ground fault detection to a change of an electrical machine condition, wherein the machine includes a winding. The electrical machine is in a first machine condition, a first reference value being defined for measured values of an electrical quantity. The ground fault detection includes continuously measuring the electrical quantity in the winding and detecting a ground fault based on the measured values of the electrical quantity and the first reference value. The method includes receiving a signal, detecting a change of machine condition based on the received signal, and changing to a second reference value for the measured values of the electrical quantity, the second reference value being different from the first reference value when the change of machine condition is detected.

15 Claims, 4 Drawing Sheets

(51) Int. Cl.
*H02H 7/00* (2006.01)
*H02H 7/08* (2006.01)

(56) References Cited

U.S. PATENT DOCUMENTS

| | | | |
|---|---|---|---|
| 4,851,766 A | | 7/1989 | Shiobara et al. |
| 4,884,023 A | | 11/1989 | Schmidt et al. |
| 5,508,620 A | * | 4/1996 | Pfiffner .......................... 324/545 |
| 5,945,802 A | * | 8/1999 | Konrad et al. ................ 318/807 |
| 6,172,509 B1 | | 1/2001 | Cash et al. |
| 6,327,124 B1 | * | 12/2001 | Fearing et al. .................. 361/31 |
| 8,405,940 B2 | * | 3/2013 | Schweitzer et al. ............ 361/42 |
| 2008/0136360 A1 | | 6/2008 | Rai |

OTHER PUBLICATIONS

International Search Report and Written Opinion of the International Searching Authority Application No. PCT/EP2011/053232 Completed: Nov. 11, 2011; Mailing Date: Nov. 22, 2011 10 pages.

* cited by examiner

METHOD FOR ADAPTATION OF GROUND FAULT DETECTION

FIELD OF THE INVENTION

The present invention relates to the field of ground fault detection in an electrical machine. In particular, it relates to adaptation of such a ground fault detection method to a change of machine operating condition.

BACKGROUND OF THE INVENTION

A ground fault in an electric machine that is connected to an electrical network may pose a considerable danger for continued operation of the machine. Whereas a single ground fault close to the neutral point may not cause any immediate danger to the machine, the occurrence of the next ground fault will generate large circulating currents that can produce severe damage. To limit ground current at a single ground fault near the terminals, the machine is often grounded via an impedance means to limit mechanical and thermal stresses, thus reducing the resultant damage to the machine. Such a grounding system is often used to provide a means for detecting ground faults within the machine.

In principle, existing systems for detecting ground faults in electrical machines are based on the measurement of an electrical quantity, for example, measured current and/or voltage values. A reference value is predefined for the measured values of the electrical quantity. A ground fault is detected based on the measured values and the predefined reference value. Alternatively, other electrical values can be estimated based on the measured values and the detection of the ground fault is made based on the estimated values and a corresponding predefined reference value. An alarm or a trip signal may be initiated when a ground fault is detected.

U.S. Pat. No. 4,851,766 discloses such a system, wherein, an impedance value is calculated based on measured current and voltage and a ground fault is detect by comparing the impedance value with a predefined reference value.

However, measured values can be significantly different under different machine conditions/states. This means that either such a method can only be applied for detecting a ground fault when the machine is in a specific status or it may conduct a false alarm or trip signal due to an inaccurate detection. Therefore, the sensitivity of a system based on this invention is reduced.

U.S. Pat. No. 6,172,509 discloses a system for detecting turn-to-turn and other winding faults in a polyphase alternating current machine, wherein measured current values are normalized. The normalization of the measured currents accounts for inherent machine imbalance and varying load. The fault detection is determined by identifying current flow changes, which however requires that several independent circuits be measured simultaneously.

U.S. Pat. No. 5,508,620 (D1) describes methods for determining ground faults in an electrical machine. It describes two different circuits in FIGS. 1a and 1b for detecting a ground fault at a stator and rotor, respectively, of an electrical machine. The fault resistance are different for the different circuits (column 4, line 5-10, and column 4, line 31-33). The faults are related to different fault resistances depending on which fault circuit and fault method is used.

SUMMARY OF THE INVENTION

The object of the present invention is to enable accurate ground fault detection in an electrical machine, wherein the condition of the machine is variable.

This object is achieved by the method for adapting a ground fault detection to a change of an operating condition of an electrical machine. The ground fault detection is conducted on the winding of an electrical machine, wherein the electrical machine is in a first machine condition. A first reference value is defined for measured values of an electrical quantity. The ground fault detection comprises continuously measuring the electrical quantity in the winding and detecting a ground fault based on the measured values of the electrical quantity and the first reference value. The method comprises receiving a signal, detecting a change of machine condition based on the received signal and, when the change of machine condition is detected, changing to a second reference value for the measured values of the electrical quantity, the second reference value being different from the first reference value.

By detecting a change of machine condition based on a received signal and switching to a reference value corresponding to that particular machine condition, the invention is able to adapt the ground fault detection to a change of machine condition and enables more accurate ground fault detection.

When an electrical machine is put into operation, it may go through different machine conditions. For example, a rotating electrical machine may start from standstill, to acceleration, then to full speed, be synchronized and further go with full load, and end with deceleration to stop. Meanwhile, the ground fault detection is intended to operate during various machine operating conditions/states, including when the machine is standstill. In order to obtain an accurate detection, changes of machine condition have to be accounted for a number of reasons.

One of the reasons is that the machine may be connected to the power system by a unit transformer and a circuit breaker. Dependent on the circuit breaker status, the ground fault detection is then sensing different amounts of equipment. When the breaker is open, only the machine is sensed for ground faults, whereas when the breaker is closed, the entire breaker and the unit transformer plus possibly additional equipment are sensed.

Another of the reasons is that the electrical machine insulation systems have some voltage dependence that may cause capacitance changes of the order of 10%. This is mainly due to the existence of end corona protection of stator winding that is usually made from non-linearly conducting materials. Thus, the stator effectively becomes larger, seen as a capacitance, when voltage is applied to it.

To obtain measured values, a transformer is arranged in a measurement circuit. However, the transformer could be affected by the voltage applied to it. This consequently affects the measured values received from the transformer. For example, for a ground fault detection based on signal injection, when the machine is in standstill, the voltage supplied to the transformer is only coming from the injection signal. While when the machine is at full load, the injected signal is superimposed on a system voltage, which may have a significant impact on measured values. Therefore, the predefined reference value corresponding to a standstill machine would not be accurate enough to be used when the machine is at full load.

Finally, there may be auxiliary equipment connected within the sensitive area of a ground fault detection system. If the ground impedance of these change, this will affect the ground fault detection system.

The received signal may be an internal signal. By internal signal, it is meant a signal used in the measurement of the ground fault detection. By analyzing the received internal signal, a change of machine condition can be detected based on the analyzed signal.

Alternatively, the received signal can be a signal external to the ground fault detection. The method further comprises detecting a change of machine condition based on the external signal. An external signal may be a breaker status, machine load, or excitation. Furthermore, an external signal may be in form of either analog or digital. In case of an analog external signal, the method further comprises analyzing the analog external signal and detecting a change of machine condition based on the analyzed external signal.

It is advantageous to use an internal signal to detect a change of machine condition, because such an internal signal is dedicated to the ground fault detection and therefore always accessible. With the internal signal there is no need to have additional signals connected in order to detect a change of machine condition.

According to one embodiment of the invention, a change of machine condition is detected by a property of the analyzed signal. For example, Root-Mean-Square amplitude, denoted as RMS, dominating frequency or dominating amplitude can be used for this purpose. The analyzed signal can be either an analog external signal or an internal signal.

According to one embodiment of the invention, the machine condition is in any one of standstill, acceleration, retardation, full speed, or full load. The method comprises measuring the electrical quantity when the machine is in one of the machine conditions and determining/defining a reference value corresponding to this specific machine condition based on the measured values of the electrical quantity. This procedure may be performed under commissioning of a protective device. The protective device includes a function for detecting ground fault and the invented method. Thus, reference values determined under commissioning will reflect the machines conditions, when the machine is connected to a real power system. Afterwards, the reference values are selectively used when the machine and the protective device are operating in the system.

According to one embodiment of the invention, the ground fault detection comprises injecting a test signal at a predefined frequency to the winding of the machine and the method comprises receiving measured values of an electrical quantity, wherein the measured values are measured at the point where the test signal is injected. The method further comprises continuously analyzing the measured signal and detecting the change of machine condition based on the analyzed signal. The measured electrical quantity is a RMS.

It is advantageous to use a RMS to determine a change of machine condition because the RMS makes a distinction between the measured values and the total amplitude of the signal. The former only contains the predefined frequency, while the latter includes all other frequencies, which amplitudes may change under varying machine conditions.

According to one embodiment of the invention, the ground fault detection comprises injecting a test signal at a predefined frequency to the winding of the machine. The method comprises receiving an external signal and detecting the change of the machine condition based on the received external signal.

BRIEF DESCRIPTION OF THE DRAWINGS

The invention will now be explained more closely by the description of different embodiments of the invention and with reference to the appended figures.

DETAILED DESCRIPTION OF THE INVENTION

Figure 1A:
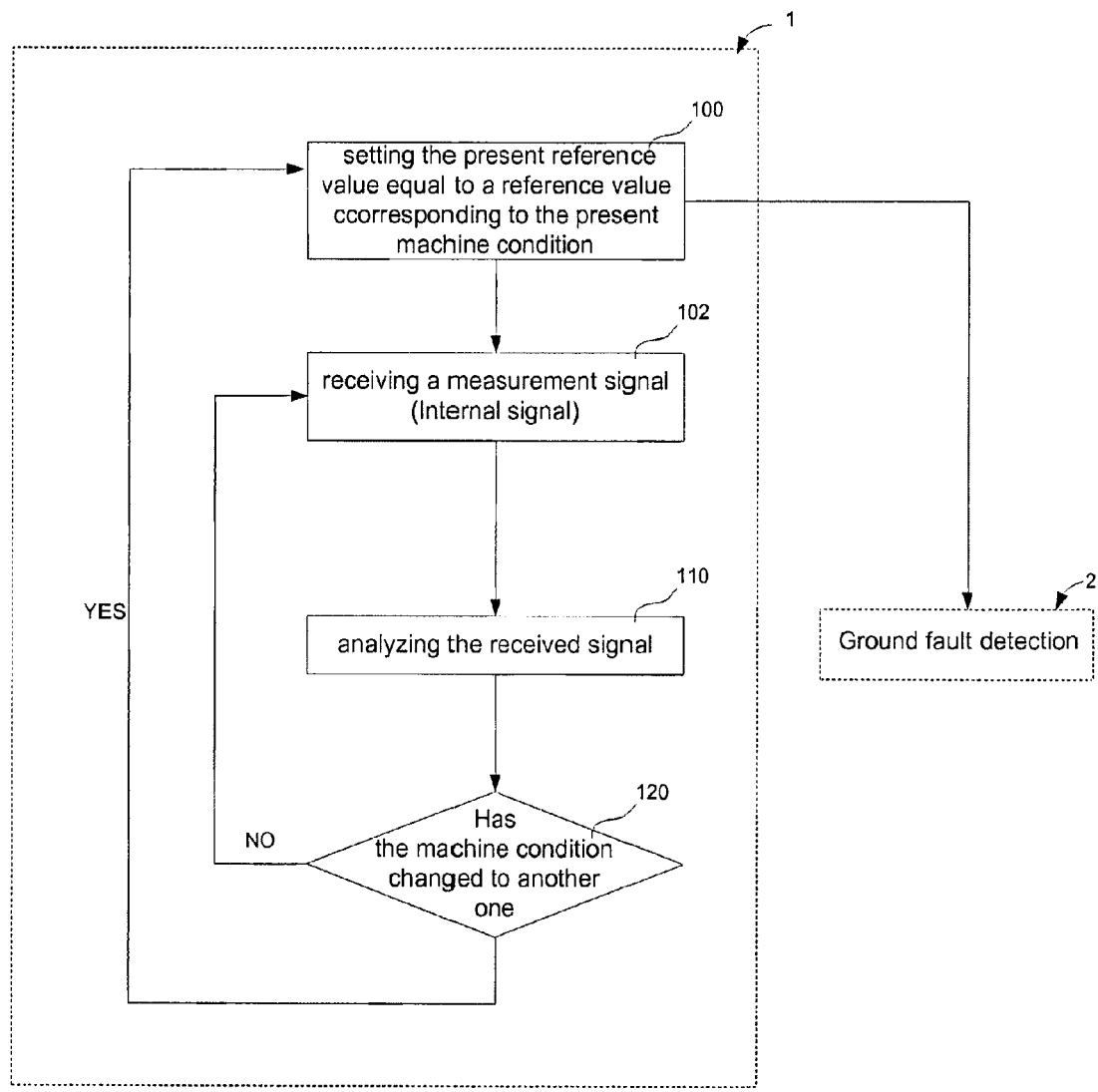
FIG. 1A shows a flow chart of the invented method to adapt ground fault protection to a change of machine condition based on an internal signal, according to one embodiment of the invention.
Figure 1B:
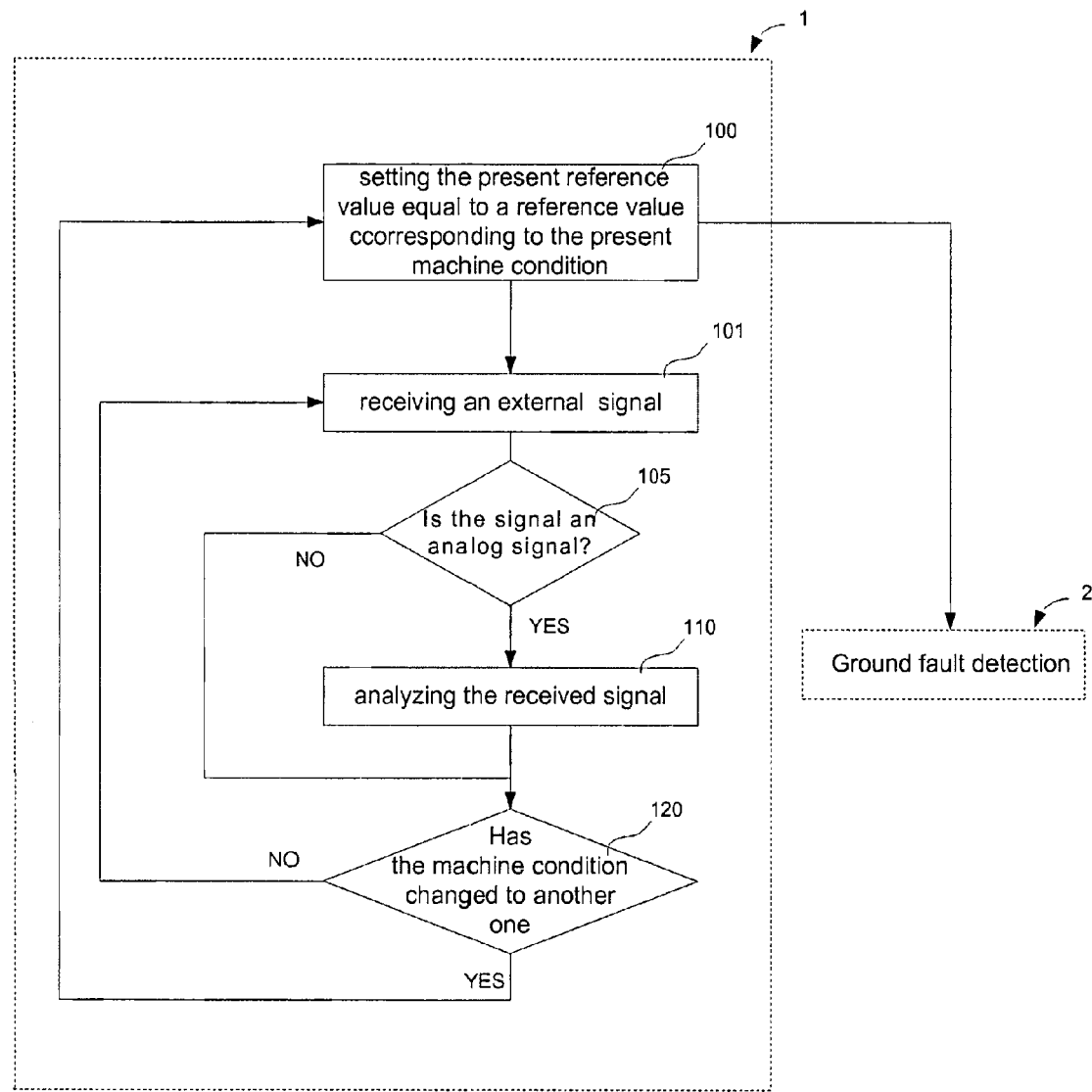
FIG. 1B shows a flow chart of the invented method to adapt ground fault protection to a change of machine condition based on an external signal, according to another embodiment of the invention.

With reference to FIGS. 1a and 1b, the invented method 1 is illustrated in conjunction with a ground fault detection function. Such a detection function is usually provided by a protective device that is connected to a conductor/winding of an electrical machine that is further connected to a power system (not shown). Such an electrical machine can be a generator or a motor for example. To detect a ground fault, the ground fault detection comprises measuring one or several electrical quantities, for example, a current and/or voltage signal(s). The measurement can be obtained through one or several instrument transformer(s) arranged in a measurement circuit.

To detect a ground fault, a reference value is predefined for measured values. When a measured value deviates from the predefined reference value, an alarm or a trip may be initiated by the ground fault detection.

Alternatively, the ground fault detection may calculate/estimate impedance to ground based on measured current and voltage values. A ground fault is detected based on this estimated impedance value and a predefined reference value. This can be exemplified as follows.

Because the ground fault can be seen as a connection to ground in parallel with the reference impedance to ground, a fault impedance value $Z_{fault}$ can be estimated by the equation, $$\frac{1}{Z_{fault}} = \frac{1}{Z_m} - \frac{1}{Z_{ref}} \tag{1}$$

Wherein $Z_m$ is a impedance value calculated based on the measured current and voltage and $Z_{ref}$ is a reference value. By comparing the estimated fault impedance $Z_{fault}$ with a predefined value, a ground fault can be determined when $Z_{fault}$ is less than the predefined value.

However, the measured current and voltage can have different levels under different machine conditions. Using one single reference value could result in an inaccurate calculated fault impedance value thus affecting the reliability of the ground fault detection. By using different values $Z_{ref}$ for different machine conditions, the fault impedance value $Z_{fault}$ can be estimated more accurately.

It should be understood that this principle could be also applicable to other ground fault estimation methods. For example, measured values can be current values. If measured current values are greater than a predefined value, a ground fault is detected.

The method may start with setting the present reference value to a value corresponding to the current machine condition at step 100, for example a value corresponding to when the machine is in standstill. As the machine is switched on, the machine is being accelerated; therefore, the machine condition is changed to acceleration. This change can be detected by a signal internal to the ground fault detection at step 102. This is because that the ground fault detection is intended to be applied to the machine all the time, meaning that the ground fault protection based thereon operates when the machine is in standstill and when it is in operation for example. Therefore, an internal signal is always measured. This internal signal is further analyzed at step 110 to determine whether the machine condition has been changed at step 120 based on a property, such as a Root-Mean-Square amplitude, a dominating frequency or dominating amplitude, of the analyzed signal. When a change is detected, the reference value corresponding to this machine condition is selected as the present references value at step 100, for example a reference value corresponding to the machine acceleration. The newly selected present reference value is further communicated to the ground fault detection. Thereafter, a ground fault is detected based on the measured values and this reference value.

Moreover, it is possible that a change of machine condition is detected based on a signal external to the ground fault detection, step 101. For example, a status of a breaker can be presented by a digital signal as "ON" or "OFF". In this case, the breaker is arranged between the electrical machine and a step-up transformer and for connecting or disconnecting the machine to the step-up transformer. The status of the breaker thus reflects also a machine condition. When the breaker is open, the measurement is the machine impedance to ground, while when the breaker is closed, the measurement may be affected by the low voltage winding of the step-up transformer. The step-up transformer may have a considerable capacitance to ground thus resulting in a need of changing reference value used in the ground fault detection. Such a change is detected at step 120.

Possibly, an external signal can be also an analog signal. In such a case, the measured signal is needed to be processed and analyzed first, step 110 based on a property, such as a RMS amplitude, a dominating frequency or dominating amplitude, of the analyzed signal. Then, the analyzed result is used to determine whether the machine has changed to another machine condition, step 120.

Figures 2, 2A:
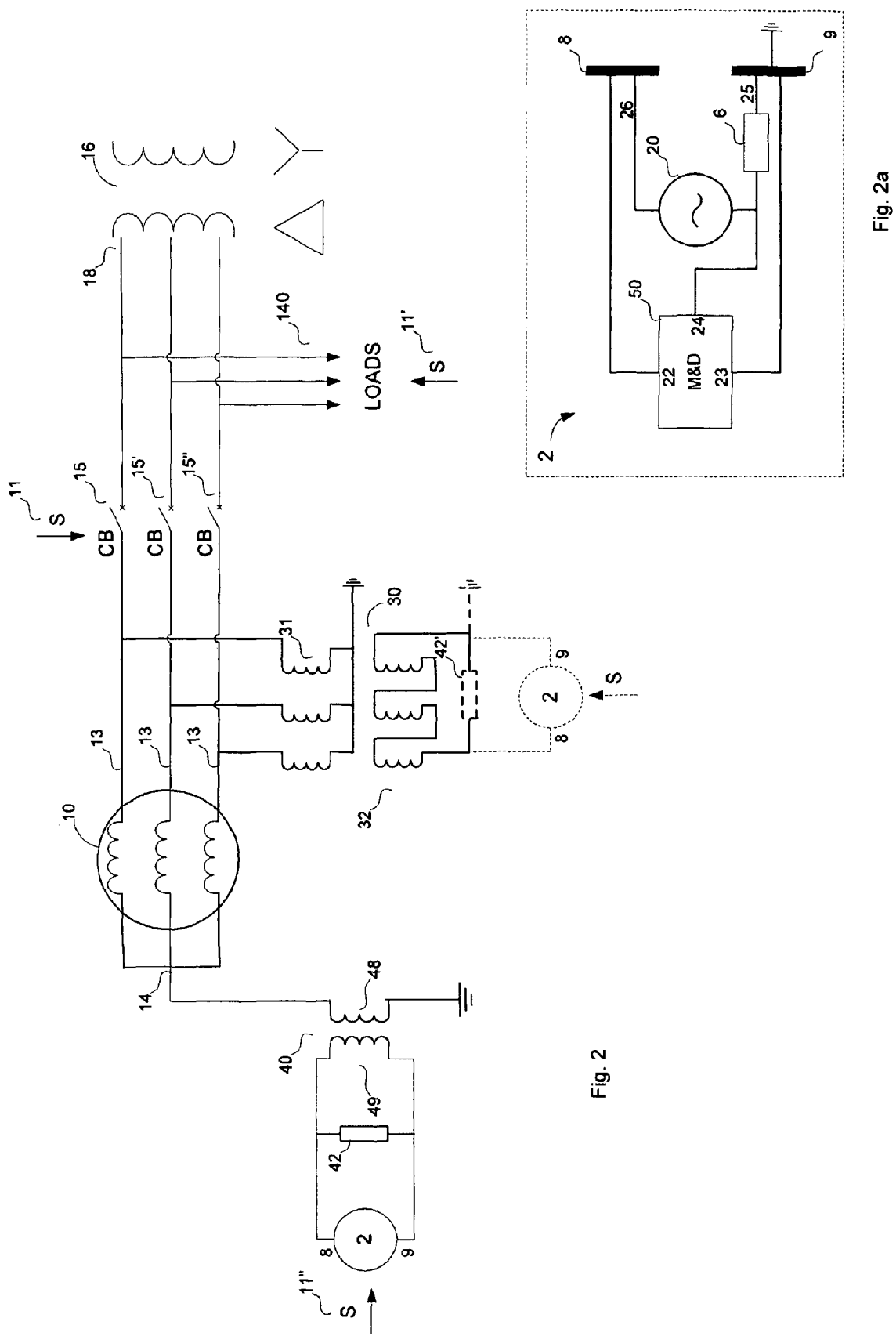
FIG. 2 illustrates a schematic diagram of a ground fault detection system including a ground fault detection function and possible locations for obtaining a signal for detecting a change of machine condition.
FIG. 2A illustrates a schematic diagram of a device 2, according to one embodiment of the invention.

FIG. 2 illustrates a schematic diagram of a part of an electrical power system including a ground fault detection device 2. The figure also shows some of possible sources from which signals for detecting a change of machine condition may be obtained. Such sources are indicated by arrows 11, 11', 11" accompanying with symbols "S".

In this example, the device 2 is arranged for detecting a ground fault in the stator windings of a three-phase generator 10.

Although, a generator is exemplified in FIG. 2, it should be understood that the invention is also applicable to other types of electrical machines, for example a motor.

The generator 10 comprises stator windings having a neutral point 14 and terminals 13 connected to the primary windings of a unit transformer 16 via breakers 15, 15' and 15". The primary windings 18 of the unit transformer 16 are delta-connected to the terminals of the generator for isolating the generator from external faults of the network. Between the breakers 15, 15', 15" and the unit transformer 16, additional loads 140 can be connected.

The neutral point 14 is connected to a distribution transformer 40 via the primary winding 48 of the distribution transformer 40. The distribution transformer 40 is arranged to provide measurement for the device 2.

The generator is further impedance grounded at the neutral point 14 via a neutral resistor 42 placed between the two ends of the secondary winding 49 of the distribution transformer. The device is connected to the neutral resistor 42 through the connection points 8 and 9 to obtain various measurements used by the device 2. The neutral resistor 42 is adapted to limit ground fault current to a value that limits the generator stator damage in case a ground fault occurs in the stator. This limit is typically in a range of 3-25 A. However, the neutral resistor 42 can be placed in other locations as well. One example is the one indicated by a dashed line as 42'.

FIG. 2a further illustrates a schematic diagram of a ground fault detection device 2, according to one embodiment of the invention. In this example, the ground fault detection is based on a signal injection. The device 2 comprises a signal injection unit 20, a fault-detecting unit 50, and a measurement circuit. The signal unit 20 is arranged to generate a test signal in form of current or voltage. The generated test signal is injected, via connections 26 and 25, to the secondary windings 49 of the transformer 40 through the connection points 8 and 9. Furthermore, the test signal is injected with a frequency different from a system frequency. With measurement circuit, the voltage difference between 22 and 23 can be measured. Furthermore, with an arrangement of a current shunt between the output of the injection unit 20 and 9 as a resistor 6, a current measurement can be obtain by measuring the voltage drop over the current shunt 6, or the voltage difference between the connection points 24 and 23. With the measured current and voltage values, an impedance value can be estimated and therefore, the ground fault can be detected based on Equation (1).

With this arrangement, the voltage differences between connections 22 and 23, 24 will be affected not only by the injected signal from unit 20 but also by other voltages present at the neutral point 14. Under a normal operating condition, the fundamental frequency voltage at the neutral point is very small but the voltage of the third harmonic may reach several percent of the nominal terminal voltage. This voltage will thus be included in the voltage and current measurement signals. The ground fault analysis has to disregard this harmonic, and other possible harmonics, by focusing on the amplitude of the injected frequency component.

Figure 3A:
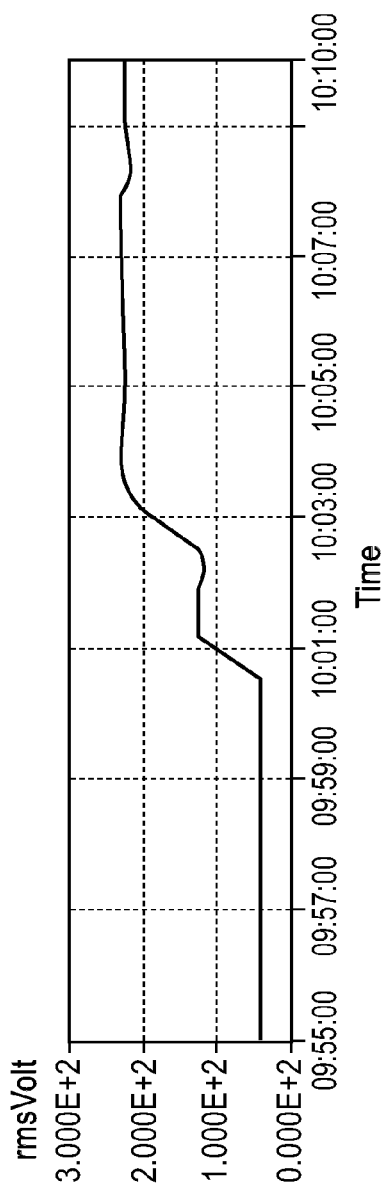
FIG. 3A illustrates a diagram of RMS level in a measured voltage channel as the machine shown in FIG. 2 is during an energization process.
Figure 3B:
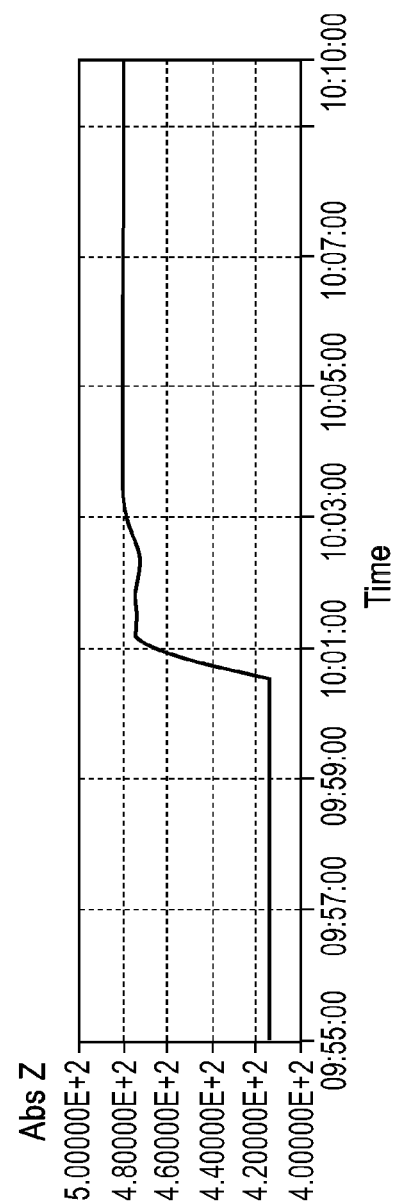
FIG. 3B illustrates a corresponding diagram of the magnitude of the estimated impedance to ground during the energization of the machine.

Furthermore, no additional signals except the injected are present at standstill. Thus, as the third harmonic is usually much larger than the injected signal, it will affect the total amplitude of the measured signal considerably and this may be quantified by the RMS value of the signal as illustrated in FIG. 3a. In this example, the machine is energized at a time point about 10:00:30. The FIG. 3b shows a corresponding diagram of the magnitude of the estimated impedance to ground at the time when the machine is energized. This shows that the magnitude level of the estimated impedance to ground has changed significantly at this time point.

The FIG. 2a shows a ground fault detection based on a signal injection and the measurement circuit comprises measuring current and voltage. However, the invention itself can be applied to other ground fault detection schemes and with different measurement arrangements.

With reference to FIG. 2, the signal that used for detecting a change of machine condition can be obtained from other sources as well. For example, a status of the breakers 15, 15' and 15" may be received. It should be understood that other possible sources might be applicable as well. In this example, the invented method is integrated into a ground fault detection function. However, it may be implemented as a separate function. Moreover, both the invented method and the ground fault detection function can be integrated into a protective device, such as an Intelligent Electronic Device (IED), for protecting, controlling, and monitoring an electrical machine that is connected to it.

The different reference values can be determined when such a protective device is under commissioning in an electrical power system.

For example, with respect to analog signals and formula (1), reference values can be performed for example as a parameter setting process. A first reference value $Z_{ref1}$ can be determined when the machine to be protected is in standstill based on estimated impedance values to ground. Then, a second reference value $Z_{ref2}$ can be determined when the machine is in operation based on the measured impedance to ground.

Furthermore, a maximal allowed alarm level may be estimated by the deviations from the active reference values observed in an standstill-operation-standstill cycle. By estimating and recording the impedance to ground during different machine conditions, the fault impedances can be evaluated using the first and second reference values, $Z_{ref1}$ and $Z_{ref2}$. The alarm level can be adjusted accordingly.

Therefore, for each specific machine condition it can be decided if it needs a reference value for this machine condition. If so, the reference value is determined accordingly.

With respect to digital signals and formula (1), the reference values corresponding to "ON" and "OFF" of a breaker can be determined respectively in a following manner. When the machine is rotating and fully magnetized and the breaker is open, meaning that an "OFF" signal is to be received, the impedance is estimated and a reference value $Z_{ref\_OFF}$ is determined. Then, the impedance is estimated when the breaker is closed, meaning an "ON" signal will be received. Furthermore, a need of reference change is decided and a reference value $Z_{ref\_ON}$ corresponding to the "ON" status of the breaker is determined.

The invention claimed is:

1. A method for adapting a ground fault detection to a change of an operating condition of an electrical machine, performed by a protective device connected to the electrical machine, wherein the machine includes a winding, the electrical machine being in a first machine operating condition, the method comprising the steps of:
   defining a first reference value for measured values of an electrical quantity,
   continuously measuring the electrical quantity in the winding and detecting a ground fault based on the measured values of the electrical quantity and the first reference value,
   receiving a signal corresponding to a change in the operating condition of the electrical machine,
   detecting the change of the operating condition of the electrical machine from the first machine operating condition to a second machine operating condition based on the received signal, the second machine operating condition being different than the first machine operating condition, and
   defining a second reference value for the measured values of the electrical quantity, the second reference value being different from the first reference value, when the change of the machine operating condition is detected, the second reference value corresponding to the detected second machine operating condition,
   wherein the first machine operating condition comprises one of: acceleration, retardation, full speed or full load and the second machine operating condition comprises one of: acceleration, retardation, full speed or full load.

2. The method according to claim 1, wherein the received signal is an internal signal used in the ground fault detection and the method further comprises analyzing the received internal signal and detecting the change of the machine operating condition based on the analyzed signal.

3. The method according to claim 1, wherein the received signal is a signal external to the ground fault detection and the method further comprises detecting the change of the machine operating condition based on the external signal.

4. The method according to claim 3, wherein the external signal is any one of breaker status, machine load or excitation and in form of analog or logic.

5. The method according to claim 4, wherein the method further comprises analyzing an analog external signal and detecting the change of the machine operating condition based on the analyzed external signal.

6. The method according to claim 2, wherein the change of the machine operating condition is detected by any one of the properties of the analyzed signal including: Root-Mean-Square amplitude, denoted as RMS, dominating frequency or dominating amplitude.

7. The method according to claim 1, wherein the ground fault detection comprises injecting a test signal at a predefined frequency to the winding of the machine and the method comprises receiving measured values of an electrical quantity, wherein the measured values being measured at the test signal injection point, and the method further comprises continuously analyzing the measured signal and detecting the change of machine operating condition based on the analyzed signal.

8. The method according to claim 1, wherein the ground fault detection comprises injecting a test signal at a predefined frequency to the winding of the machine and the method comprises receiving an external signal and detecting the change of the machine operating condition based on the received external signal.

9. The method according to claim 1, further comprising the steps of:
   receiving a second signal corresponding to a change in the operating condition of the electrical machine,
   detecting the change of the operating condition of the electrical machine from the second machine operating condition to a third machine operating condition based on the received signal, the third machine operating condition being different than the first and second machine operating conditions, and
   defining a third reference value for the measured values of the electrical quantity, the third reference value being different from the first and second reference values, the third reference value corresponding to the detected third machine operating condition,
   wherein the third machine operating condition comprises one of: standstill, acceleration, retardation, full speed or full load.

10. A system for adapting a ground fault detection to a change of an operating condition of an electrical machine, the system comprising:
   a protective device connected to the electrical machine having a winding, the machine being in a first machine operating condition; and a measurement device coupled to said protective device, said measurement device measuring values of an electrical quantity of the electrical machine;

said protective device defining a first reference value based on the measured values of the electrical quantity;

said measurement device continuously measuring the electrical quantity in the winding while the electrical machine is in the first machine operating condition, and said protective device detecting a ground fault based on the measured values of the electrical quantity and the first reference value;

said protective device receiving a signal corresponding to a change in the operating condition of the electrical machine from the first machine operating condition to a second machine operating condition;

said protective device defining a second reference value based on the second machine operating condition;

said measurement device continuously measuring the electrical quantity in the winding while the electrical machine is in the second machine operating condition, and said protective device detecting a ground fault based on the measured values of the electrical quantity and the second reference value;

wherein the first machine operating condition comprises one of: acceleration, retardation, full speed or full load and the second machine operating condition comprises one of: acceleration, retardation, full speed or full load.

11. The system according to claim 10, wherein the received signal is any of: breaker status, machine load or excitation.

12. The system according to claim 10, wherein the change of the machine operating condition is detected by any one of the properties of the received signal including: Root-Mean-Square amplitude, denoted as RMS, dominating frequency or dominating amplitude.

13. The system according to claim 10, wherein the machine operating condition is in any one of: standstill, acceleration, retardation, full speed or full load.

14. The system according to claim 10, wherein the ground fault detection comprises injecting a test signal at a predefined frequency into the winding of the machine.

15. The system according to claim 10, wherein, said protective device receiving a second signal corresponding to a change in the operating condition of the electrical machine from the second machine operating condition to a third machine operating condition;

said protective device defining a third reference value based on the third machine operating condition;

said measurement device continuously measuring the electrical quantity in the winding while the electrical machine is in the third machine operating condition, and said protective device detecting a ground fault based on the measured values of the electrical quantity and the third reference value;

wherein the third machine operating condition comprises one of: standstill, acceleration, retardation, full speed or full load.

* * * * *